United States Patent
Hu et al.

(10) Patent No.: US 11,946,878 B2
(45) Date of Patent: Apr. 2, 2024

(54) DEVICE AND RELATED METHOD FOR PROVIDING UNIDIRECTIONAL MICROWAVE PROPAGATION

(71) Applicant: UNIVERSITY OF MANITOBA, Winnipeg (CA)

(72) Inventors: Can-Ming Hu, Winnipeg (CA); Yi-Pu Wang, Winnipeg (CA); Yongsheng Gui, Winnipeg (CA); Mun Kim, Winnipeg (CA)

(73) Assignee: University of Manitoba, Winnipeg (CA)

( * ) Notice: Subject to any disclaimer, the term of this patent is extended or adjusted under 35 U.S.C. 154(b) by 689 days.

(21) Appl. No.: 17/117,701

(22) Filed: Dec. 10, 2020

(65) Prior Publication Data
US 2021/0181123 A1    Jun. 17, 2021

Related U.S. Application Data

(60) Provisional application No. 62/947,631, filed on Dec. 13, 2019.

(51) Int. Cl.
*H01Q 7/06* (2006.01)
*G01N 22/00* (2006.01)
(Continued)

(52) U.S. Cl.
CPC ............ *G01N 22/00* (2013.01); *H01F 1/346* (2013.01); *H01P 3/081* (2013.01); *H01Q 7/00* (2013.01);
(Continued)

(58) Field of Classification Search
CPC .......... H01Q 1/38; H01Q 7/06; H01Q 9/0457; H01Q 13/18; H01Q 13/106; H01Q 21/064;
(Continued)

(56) References Cited

U.S. PATENT DOCUMENTS 5,581,266 A * 12/1996 Peng ................... H01Q 13/106
343/770
6,507,320 B2 * 1/2003 Von Stein ............ H01Q 21/245
343/768

(Continued)

*Primary Examiner* — Tung X Le
(74) *Attorney, Agent, or Firm* — Christopher J. Dynowski; Michael R. Williams; Ade & Company Inc.

(57) ABSTRACT

A device for unidirectional propagation of microwaves comprises a resonant microwave structure arranged to transmit microwaves between two ports and a magnetic source arranged to provide a generally static magnetic field and to have a resonant frequency distinct from that of the microwave structure, which is disposed adjacent the microwave structure so as to be located in presence of electromagnetic fields emanating from the transmitted microwaves such that the magnetic field interacts with the electromagnetic fields of the microwaves so as to form a set of hybridized resonant frequencies at which zero intrinsic damping exists, one of the set of hybridized resonant frequencies being a real eigenvalue providing the unidirectional propagation from one of the first and second ports to the other. A related method comprises arranging the magnetic source at a prescribed position where the real eigenvalue matches the frequency of an input signal applied at a selected port.

22 Claims, 10 Drawing Sheets

(51) Int. Cl.
    *H01F 1/34*     (2006.01)
    *H01P 3/08*     (2006.01)
    *H01Q 1/36*     (2006.01)
    *H01Q 7/00*     (2006.01)
    *H05K 1/02*     (2006.01)
    *H01P 1/36*     (2006.01)
    *H01P 1/38*     (2006.01)

(52) U.S. Cl.
    CPC ............. *H05K 1/0237* (2013.01); *H01P 1/36* (2013.01); *H01P 1/38* (2013.01)

(58) Field of Classification Search
    CPC . H01Q 21/245; H01P 1/36; H01P 1/38; H01P 1/365; H01P 1/387; H01P 1/2039; H01P 1/2084; H01P 3/081
    See application file for complete search history.

(56) References Cited

U.S. PATENT DOCUMENTS

| | | | |
|---|---|---|---|
| 10,444,340 B2 * | 10/2019 | Nagaishi | G01S 13/58 |
| 2002/0044098 A1 * | 4/2002 | Von Stein | H01Q 13/106 |
| | | | 343/770 |
| 2008/0238793 A1 * | 10/2008 | Channabasappa | H01Q 9/0457 |
| | | | 343/767 |
| 2017/0026207 A1 * | 1/2017 | Kakinuma | H04B 1/28 |
| 2021/0032167 A1 * | 2/2021 | Hill | H01P 11/008 |

\* cited by examiner

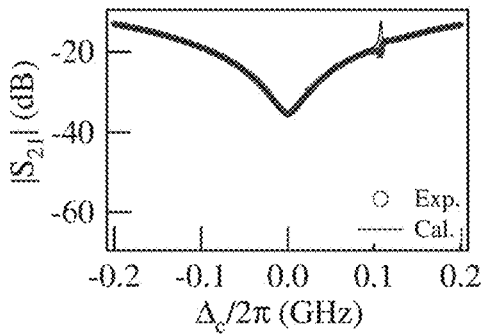
FIG. 6G
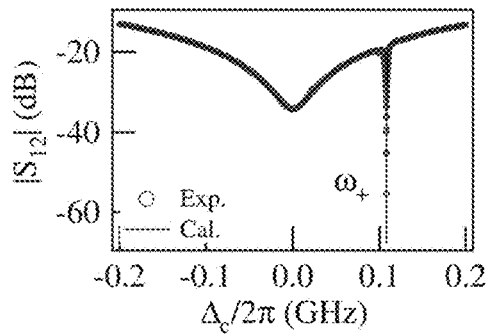
FIG. 6H
FIG. 7A
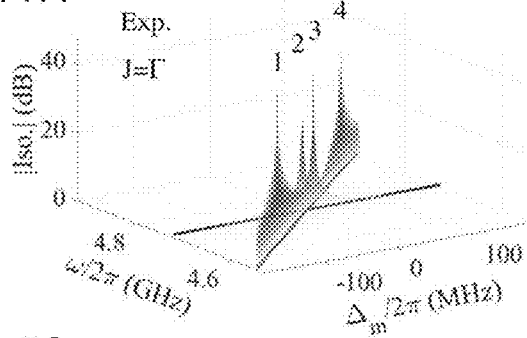
FIG. 7B
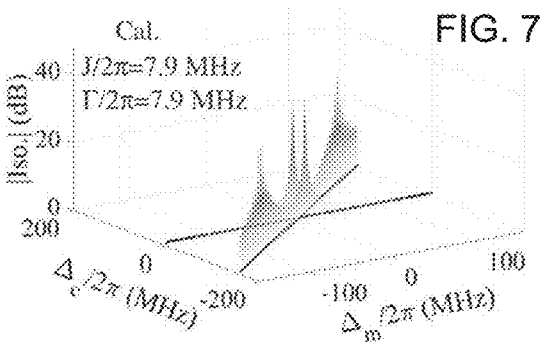
FIG. 7C
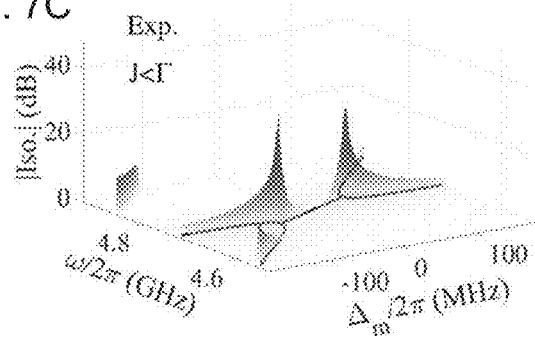
FIG. 7D
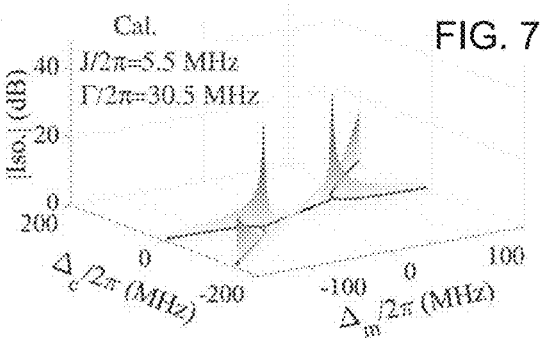
FIG. 7E
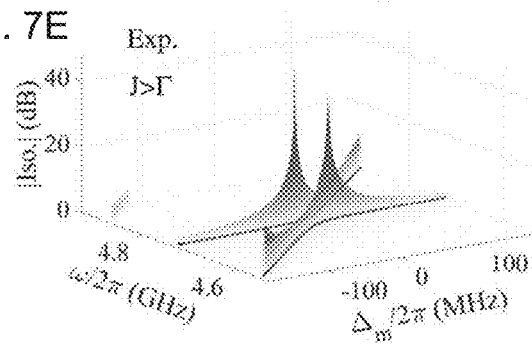
FIG. 7F
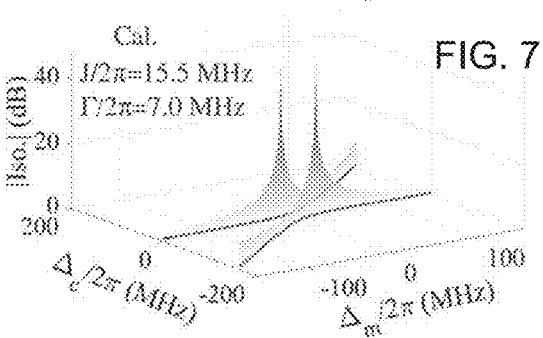

FIG. 10A
FIG. 10B
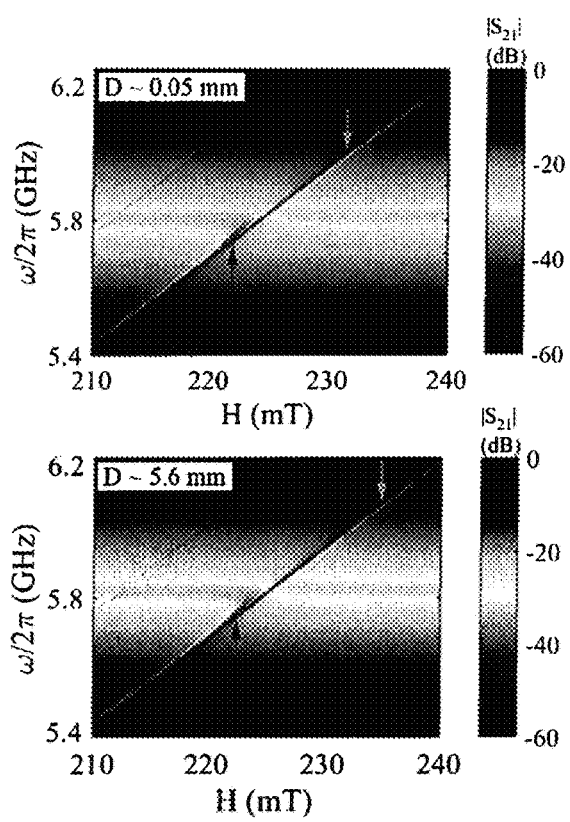
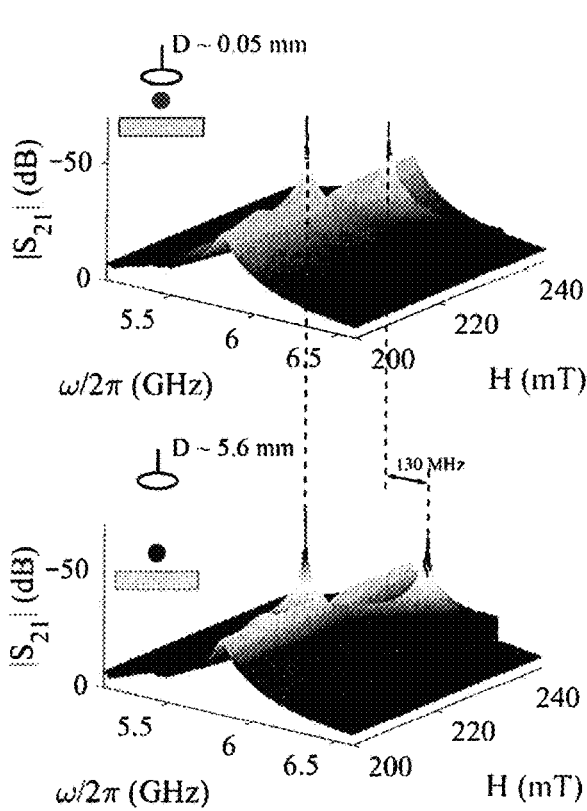
FIG. 10C
FIG. 10D

FIG. 12A
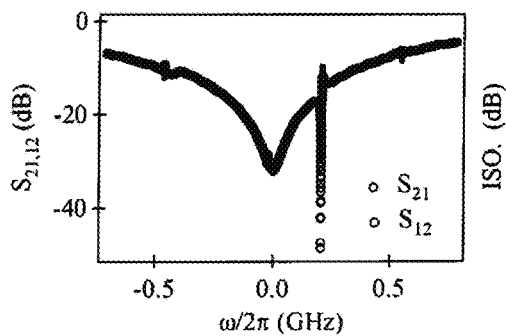
FIG. 12B
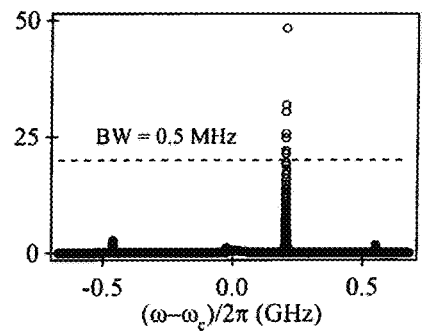
FIG. 12C
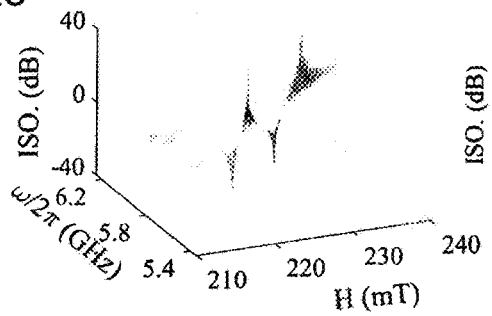
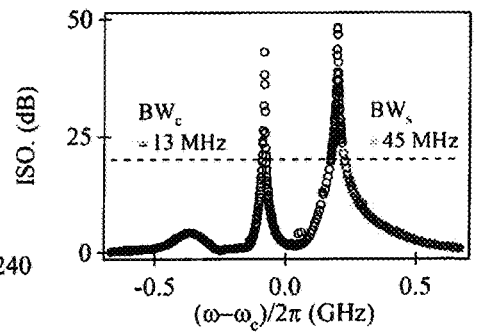
FIG. 12D
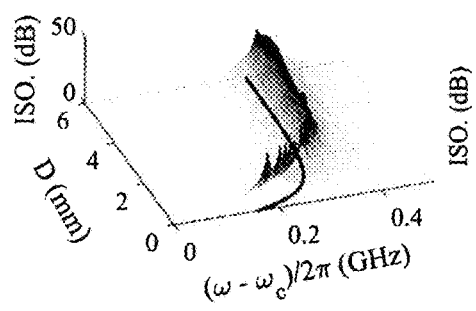
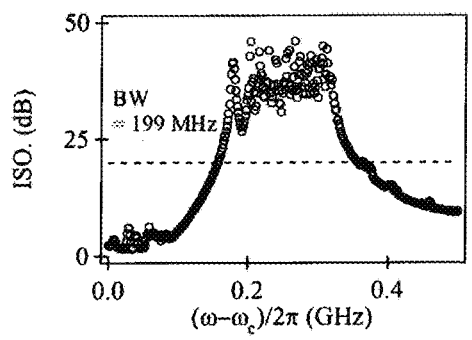
FIG. 12E  FIG. 12F

DEVICE AND RELATED METHOD FOR PROVIDING UNIDIRECTIONAL MICROWAVE PROPAGATION

This application claims the benefit under 35 U.S.C. 119(e) of U.S. Provisional Ser. No. 62/947,631 filed Dec. 13, 2019, which is incorporated by reference herein.

FIELD OF THE INVENTION

The present invention relates to microwave devices and related methods, and more particularly to a microwave device and related method capable of providing unidirectional propagation of microwaves through same.

BACKGROUND

Reciprocity is ubiquitous in nature, but sensitive signal detection and processing, especially in the delicate quantum regime [1], requires nonreciprocal operations. The case of greatest interest is electromagnetic nonreciprocity [2], which focuses on the nonreciprocal propagation of electromagnetic fields ranging from microwave [3-6], terahertz [7], and optical [8-12] to x-ray frequencies [13]. In addition, acoustic [14,15] and phononic [16,17] nonreciprocities have been reported and have their own applications. Nonreciprocity may be achieved using different mechanisms, such as Faraday rotation [18-22], optomechanical interactions [4,5,8,12], reservoir engineering [11,23], and parametric time modulation [9,24]. However, in practice, achieving large nonreciprocity with flexible controllability remains a demanding issue, especially in the linear response regime [2,25].

Recently, cavity magnonics has attracted a lot of attention [26-33]. Such hybrid systems show great application prospects in quantum information processing, acting as either a quantum transducer [34-40] or quantum memory [41]. A versatile magnon-based quantum information processing platform has taken shape [42]. However, in conventional cavity magnonics systems governed by coherent magnon-photon coupling, nonreciprocity is missing [43]. Last year, an intriguing dissipative magnon-photon coupling was discovered [44,45], which has quickly been verified as ubiquitous [46-52]. Microscopically, dissipative coupling results from the traveling-wave-induced [51] cooperative external coupling [23,52,53].

SUMMARY OF THE DISCLOSURE

It is one object of this disclosure to show that the interference of coherent and dissipative magnon-photon couplings makes it possible to break time-reversal symmetry. Furthermore, another object is to show that a unique scheme of nonreciprocity has flexible controllability, which enables a high isolation ratio accompanied by low insertion loss. Yet another object is to provide an a priori reference for exploring nonreciprocity at different frequencies based on the interference of coherent and dissipative couplings in other systems.

According to an aspect of the invention there is provided a device for providing unidirectional propagation of microwaves comprising:

first and second ports for coupling to other devices configured to generate or receive microwaves and between which the microwaves are to be transmitted;
a magnetic source arranged to provide a static magnetic field;
a microwave structure disposed in the static magnetic field and operatively coupled to the first and second ports so that the microwaves are transmittable therebetween, the microwave structure comprising:
   a transmission line configured for transmitting the microwaves between the first and second ports;
   a cavity structure which is electrically or magnetically coupled to the transmission line and configured to define a resonant frequency of the microwave structure which is exhibited along the transmission line; and
a ferromagnetic body disposed in the static magnetic field adjacent the microwave structure so as to be located in presence of electromagnetic fields emanating from the microwaves transmitted along the transmission line, and arranged so that an induced magnetic field emanating from the ferromagnetic body having a resonant frequency distinct from the resonant frequency of the microwave structure interacts with the electromagnetic fields of the microwaves so as to form a set of hybridized resonant frequencies at which zero damping exists, one of the set of hybridized resonant frequencies being a real eigenvalue providing the unidirectional propagation from one of the first and second ports to the other.

In one arrangement, the magnetic source is a permanent magnet.

According to another aspect of the invention there is provided a device for providing unidirectional propagation of microwaves comprising:

first and second ports for coupling to other devices configured to generate or receive microwaves and between which the microwaves are to be transmitted;
a microwave structure operatively coupled to the first and second ports so that the microwaves are transmittable therebetween, the microwave structure comprising:
   a transmission line configured for transmitting the microwaves between the first and second ports;
   a cavity structure which is electrically or magnetically coupled to the transmission line and configured to define a resonant frequency of the microwave structure which is exhibited along the transmission line; and
a magnetic source arranged to provide a generally static magnetic field and to have a resonant frequency distinct from the resonant frequency of the microwave structure, the magnetic source being disposed adjacent the microwave structure so as to be located in presence of electromagnetic fields emanating from the microwaves transmitted along the transmission line, such that the magnetic field interacts with the electromagnetic fields of the microwaves so as to form a set of hybridized resonant frequencies at which zero damping exists, one of the set of hybridized resonant frequencies being a real eigenvalue providing the unidirectional propagation from one of the first and second ports to the other.

In one arrangement, the magnetic source is a ferromagnetic body producing an induced magnetic field due to a static magnetic field of a distinct magnetic source in which the microwave structure is also located.

Preferably, in regard to the ferromagnetic body, that is the magnetic source which is in the presence of the electromagnetic fields of the microwaves which are transmitted along the transmission line, the position thereof relative to the microwave structure is adjustable such that the device can be tuned to provide unidirectional propagation for various frequencies of microwaves.

Preferably, in regard to the ferromagnetic body, that is the magnetic source which is in the presence of the electromagnetic fields of the microwaves which are transmitted along the transmission line, the position thereof relative to the microwave structure is arranged such that, at said position, a magnitude of a magnetic portion of the electromagnetic field of the microwaves transmitted along the transmission line is less than the maximum magnitude thereof, and a magnitude of an electric portion of the electromagnetic field of said microwaves is greater than zero.

In one arrangement, the ferromagnetic body comprises a ferrimagnetic material.

In one arrangement, the ferromagnetic body comprises yttrium iron garnet.

In one arrangement, the microwave structure is formed on a printed circuit board such that the transmission line is in the form of a microstrip, and the ferromagnetic body is adjacent a side of the printed circuit board on which the microstrip transmission line is formed.

In one arrangement, the device further includes an antenna supported adjacent to the ferromagnetic body and arranged to magnetically interact with the ferromagnetic body so as to modify properties of the ferromagnetic body associated with the induced magnetic field thereof for tuning at least one of the set of hybridized resonant frequencies.

In one arrangement, the antenna is non-energized such that the antenna magnetically interacts with the ferromagnetic body by coupling with the induced magnetic field of the ferromagnetic body to change an extrinsic damping rate of the ferromagnetic body, so as to tune one of the set of hybridized resonant frequencies.

In one such arrangement, a position of the antenna relative to the ferromagnetic body is adjustable such that said one of the set of hybridized resonant frequencies is tuned by repositioning the antenna.

In another arrangement having the antenna, the antenna is energized with an electrical current so as to provide a distinct static magnetic field such that the antenna magnetically interacts with the ferromagnetic body by inducing the ferromagnetic body to change the resonant frequency thereof, so as to tune the set of hybridized resonant frequencies.

In one such arrangement, a strength of the distinct static magnetic field of the antenna is adjustable such that the set of hybridized resonant frequencies is tuned by adjusting the strength of the distinct static magnetic field.

In one arrangement, the antenna is a loop antenna.

In one arrangement, the device is for use as an isolator.

In another arrangement, the device is for use as a circulator.

In yet another arrangement, the device is for use in microwave imaging.

In a further arrangement, the device is for use in microwave switching.

According to yet another aspect of the invention there is provided a method of providing unidirectional signal transmission for microwaves comprising:
  providing a magnetic source arranged to provide a static magnetic field;
  providing, in the static magnetic field, a microwave structure configured to transmit the microwaves between two ports and having a resonant frequency;
  providing, in the static magnetic field, a ferromagnetic body adjacent the microwave structure so as to be located in presence of electromagnetic fields emanating from the microwaves transmitting along the microwave structure, and arranged so that an induced magnetic field emanating from the ferromagnetic body having a resonant frequency distinct from the resonant frequency of the microwave structure interacts with the electromagnetic fields of the microwaves transmitted through the microwave structure so as to form a set of hybridized resonant frequencies at which zero damping exists in the microwave structure, one of the set of hybridized resonant frequencies being a real eigenvalue corresponding to a frequency providing substantially unidirectional propagation from one of the ports to the other port;
  applying an input microwave signal of an input frequency at a selected one of the two ports; and
  arranging the ferromagnetic body at a prescribed position relative to the microwave structure at which the eigenvalue which corresponds to transmission from the selected port to the other one of the two ports becomes a pure real value which matches the frequency of the input signal, so that the input microwave signal is transmitted from the selected port to the other port substantially without transmission of any signals in a reverse direction.

According to further aspect of the invention there is provided a method of providing unidirectional signal transmission for microwaves comprising:
  providing a microwave structure configured to transmit the microwaves between two ports and having a resonant frequency;
  providing a magnetic source, which is arranged to provide a generally static magnetic field and to have a resonant frequency distinct from the resonant frequency of the microwave structure, adjacent the microwave structure such that the magnetic field of the magnetic source interacts with electromagnetic fields of the microwaves transmitted through the microwave structure so as to form a set of hybridized resonant frequencies at which zero damping exists in the microwave structure, one of the set of hybridized resonant frequencies being a real eigenvalue corresponding to a frequency providing substantially unidirectional propagation from one of the ports to the other port;
  applying an input microwave signal of an input frequency at a selected one of the two ports; and
  arranging the magnetic source at a prescribed position relative to the microwave structure at which the eigenvalue which corresponds to transmission from the selected port to the other one of the two ports becomes a pure real value which matches the frequency of the input signal, so that the input microwave signal is transmitted from the selected port to the other port substantially without transmission of any signals in a reverse direction.

Preferably, arranging the magnetic source at the prescribed position relative to the microwave structure comprises positioning the magnetic source such that a magnitude of a magnetic portion of the electromagnetic field of the microwaves transmitted along the transmission line is less than the maximum magnitude thereof, and a magnitude of an electric portion of the electromagnetic field of said microwaves is greater than zero.

The method may further include arranging an antenna adjacent the magnetic source to magnetically interact with the magnetic source in order to tune the eigenvalue which becomes the pure real value towards the frequency of the input signal. Typically this is done by modifying properties of the magnetic source which are associated with the magnetic field provided thereby.

In one such arrangement, arranging the antenna to magnetically interact with the magnetic source in order to tune the eigenvalue which becomes the pure real value towards the frequency of the input signal comprises arranging the antenna at a prescribed position relative to the magnetic source to couple with the magnetic field thereof.

In another arrangement, arranging the antenna to magnetically interact with the magnetic source in order to tune the eigenvalue which becomes the pure real value towards the frequency of the input signal comprises providing a distinct static magnetic field of the antenna arranged to modify the resonant frequency of the magnetic source.

BRIEF DESCRIPTION OF THE DRAWINGS

The invention will now be described in conjunction with the accompanying drawings in which:

FIGS. 6G and 6H show measured and calculated $|S_{21}|$ and $|S_{12}|$ spectra, respectively, measured at the field marked by the magenta (right-hand) arrow in FIGS. 6A-6B;

FIGS. 7A, 7C and 7E are graphs showing measured isolation ratio as a function of the working frequency to and the field detuning $\Delta_m$ when $J=\Gamma$ (FIG. 7A), $J<\Gamma$ (FIG. 7B), and $J>\Gamma$ (FIG. 7C), wherein in FIG. 7A four isolation peaks are labeled, and wherein blue solid curves are the dispersion of the coupled magnonphoton modes;

FIGS. 7B, 7D and 7F are graphs showing calculated isolation ratio with different coupling strengths;

FIGS. 10A and 10B are a mapping of $S_{21}$ and a surface plot of the system, respectively, at D=0.05 mm where the influence of the loop reaches a maximum;

FIGS. 10C and 10D are a mapping of $S_{21}$ and a surface plot of the system, respectively, at D=5.6 mm where the loop is far away from the YIG sphere and the effect of the loop is negligible;

FIG. 12A is a graph of transmission spectra near the side ZDC for a given $\tilde{\omega}_2$;

FIG. 12B is a graph of Isolation rate as function of driving frequency, the instantaneous spectral bandwidth for isolation over 20 dB is 0.5 MHz which is relative narrow;

FIG. 12C is a surface plot of isolation as a function of magnetic field and driving frequency, using gradient color where transparent color denotes zero isolation;

FIG. 12D is a graph of isolation rate as a function of working frequency;

FIG. 12E is a graph of isolation as a function of the magnetic loop distance D; and FIG. 12F is a graph of isolation as function of driving frequency.

DETAILED DESCRIPTION

Figure 1:
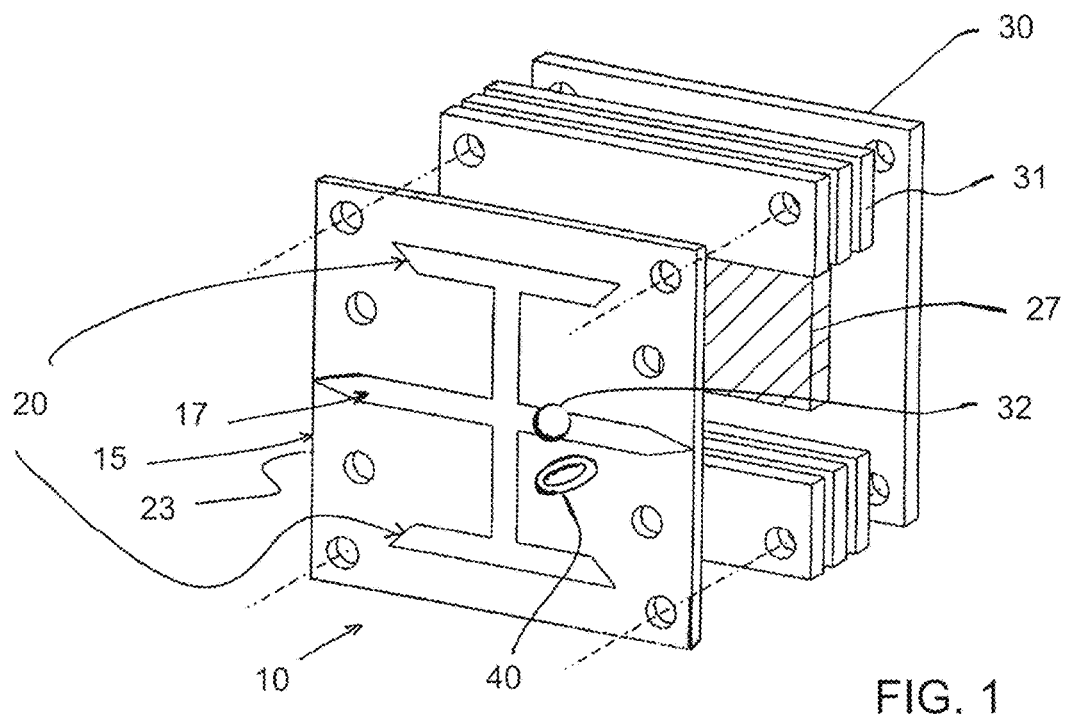
FIG. 1 is an exploded view of an arrangement of device according to the present invention.
Figure 2:
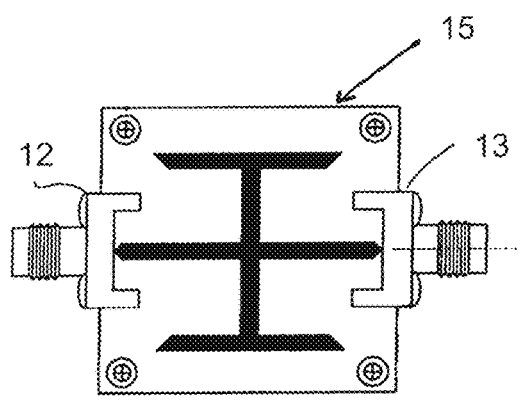
FIG. 2 is a plan view of the device of FIG. 1.
Figure 3:
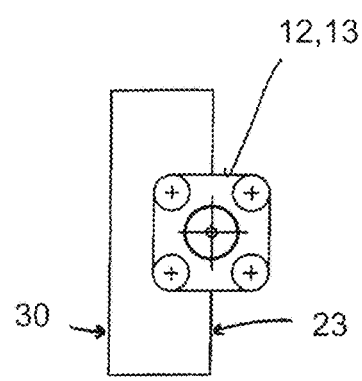
FIG. 3 is an end view of the device of FIG. 1.
Figure 4:
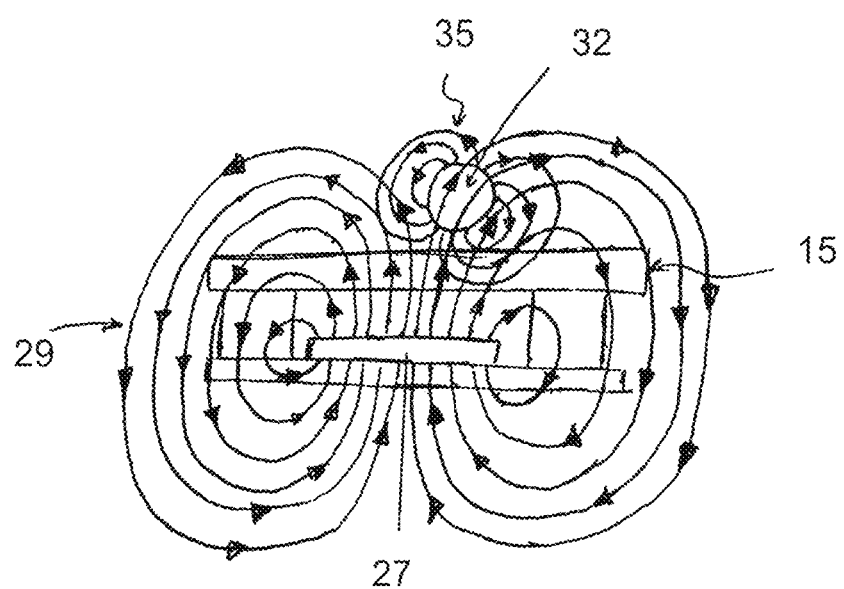
FIG. 4 is a schematic view of the device of FIG. 1, with some components removed for clarity of illustration, showing magnetic fields.

With reference to the accompanying figures, the present invention relates to a microwave device and related method capable of providing unidirectional propagation of microwaves through the device.

FIGS. 1-4 show the device in the form of an isolator 10. However, it will be appreciated that the device may also be in the form of a circulator or be for use in microwave imaging or microwave switching using a similar and suitably modified basic structure.

Referring to FIGS. 1-4, the isolator 10 comprises first and second ports 12, 13 for coupling to other devices configured to generate or receive microwaves and between which the microwaves are to be transmitted, such as a vector network analyzer.

The isolator 10 includes a microwave structure 15 operatively coupled to the first and second ports 12, 13 so that microwaves are transmittable therebetween. The microwave structure 15 comprises a transmission line 17 configured for transmitting the microwaves between the first and second ports 12, 13 and a cavity structure 20 which is electrically or magnetically coupled to the transmission line 17 and configured to define a resonant frequency of the microwave structure 15 which is exhibited along the transmission line 17. This is also referred to herein as the cavity mode or cavity resonance. In the illustrated arrangement, the microwave structure 15 is formed on a printed circuit board 23 having a substrate on one side thereof and exposed metallic surfaces on an opposite side from which the electromagnetic waves of the microwaves are emanating, such that the transmission line 17 is in the form of a microstrip formed on a planar microwave structure. The cavity structure 20 of the illustrated arrangement comprises a microstrip structure including a pair of T-shaped conductors which are attached to the transmission line 17 so as to be electrically and magnetically connected to same. More specifically, the isolator 10 of the illustrated arrangement is a Michelson-like interferometer with two short-terminated vertical arms and two horizontal arms for the measurements. It has a microstrip-cross-junction topology. Depending on lengths of the T-shaped conductors, the electrical and magnetic coupling of the cavity structure of the illustrated arrangement may be predominantly electrical, in other words capacitive, or predominantly magnetic, in other words inductive.

Thus the microwave structure 15 is an open system which can support both standing waves and travelling waves.

In an example construction of the isolator 10, the printed circuit board 23 is a commercially available RO4003C model manufactured by Rogers, and the microstrip is formed from copper cladding having 0.035 mm thickness with $Z_0$=50Ω. The Rogers RO4003C PCB is square-shaded with an overall length and overall width of 25 mm. The ports 12, 13 are generally centrally located on opposite sides of the PCB so that the distance from one side of a port and across to a distal side of the PCB is 16.5 mm. In other words, the distance from one side to the proximal side of the PCB is 6.5 mm. Apertures in the PCB for fasteners for interconnecting with other components, which will be described shortly, are spaced apart by 21 mm on center, meaning the apertures are spaced about 2 mm on-center from the proximal side of the PCB. The ports extend 9 mm from the side of the PCB on which they are mounted.

The isolator 10 includes a magnetic source such as a permanent magnet 27 arranged to provide an external static magnetic field 29 in which the microwave structure 15 is disposed. In the illustrated arrangement the externally applied static magnetic field 29 is oriented perpendicular to a plane of the microwave structure, and the source 27 is mounted on a side of the microwave structure 15 free of the emanating electromagnetic fields of the transmitted microwaves. The magnetic source 27 is supported in spaced condition to the microwave structure 15 on a base plate 30 providing a grounding effect that is mechanically connected to the microwave structure via spacer blocks 31.

In an example construction of the isolator, the permanent magnet 27 is a neodymium magnet, the base plate 30 is a metal plate having 0.75 mm thickness, and the spacer blocks 31 are commercially available FR4 models from manufacturer Rogers. Thus, in the example construction described herein, the overall thickness of the isolator 10 is 6.3 mm from the PCB 23 to the base plate 30.

The isolator 10 further includes a ferromagnetic body 32 distinct from the magnetic source 27 that is disposed in the static magnetic field adjacent the microwave structure 15 so as to be located in presence of electromagnetic fields emanating from the microwaves transmitted along the transmission line 17. The ferromagnetic body 32 is arranged so that an induced magnetic field 35 emanating from the ferromagnetic body 32 having a resonant frequency distinct from the resonant frequency of the microwave structure 15 interacts with the electromagnetic fields of the microwaves so as to form a set of hybridized resonant frequencies at which zero damping exists. That is, the ferromagnetic body 32 provides a second type of resonance with a different resonant frequency from that of the microwave structure, which electromagnetically interacts in both constructive (coherent) and destructive (dissipative) manners with the fields of the transmitted microwaves so as to form a combinative electromagnetic resonance. The coupling constant between two resonances can be described by a complex number. The real part is coherent coupling (describing the energy exchange) and the imaginary part (describing the damping exchange) is dissipative coupling.

Typically, the set of hybridized resonant frequencies is a pair of such frequencies, and one of the set of hybridized resonant frequencies is a real eigenvalue providing the unidirectional propagation from one of the first and second ports 12, 13 to the other. This occurs when the coherent and dissipative coupling factors are greater than intrinsic damping rates of the cavity and magnon modes which generally are fixed values predetermined by the microwave structure 15 and the ferromagnetic body 32. Furthermore, in this case the dissipative coupling of the cavity and magnon resonances is nonzero. As such, microwaves can freely propagate in one direction but they are completely blocked in the other opposite direction.

The pair of hybridized resonant frequencies is associated with a center-zero damping condition (ZDC) occurring at a frequency which is proximal to the resonant frequency of the cavity structure and a side ZDC which occurs at a frequency distal to the frequency of cavity structure resonance. Generally speaking, the separation or distance in frequency between the center-ZDC and the side-ZDC is determined by interference between the dissipative coupling and coherent coupling (characterized by their multiplicative product).

When the microwave structure has a printed circuit board construction, the ferromagnetic body 32 is adjacent a side of the printed circuit board 23 on which the microstrip transmission line 17 is formed.

In the illustrated arrangement, the ferromagnetic body comprises a ferrimagnetic material such as yttrium iron garnet (YIG) having a weak form of ferromagnetism associated with parallel but opposite alignment of neighboring atoms which do not cancel out so that there is a net magnetic moment, which is sufficient to provide the magnon resonance. For example, the YIG sphere has a 1 mm diameter.

Basically, the ferromagnetic body has electrons generally fixed in space but with spins which can be changed in direction by an externally applied magnetic field.

The specific resonant frequency exhibited by the ferromagnetic body depends on factors including size, shape and material of the ferromagnetic body; strength of the static magnetic field which acts to induce the magnetic field emanating from the ferromagnetic body; orientation of the body in the inducing static magnetic field; and macroscopic or average magnetization of the ferromagnetic body.

In other arrangements which are not shown, the combination of the externally applied magnetic field 29 produced by the magnetic source 27 and the ferromagnetic body 32 may be replaced by a single magnetic source disposed adjacent the microwave structure so as to be located in the presence of the electromagnetic fields emanating from the transmitted microwaves and which is arranged to provide a generally static magnetic field and to have a resonant frequency distinct from the resonant frequency of the microwave structure. Preferably this resonant magnetic source is an electrical insulator.

In regard to the resonant magnetic source which is in the vicinity of the microwave structure 15 so as to interact with the electromagnetic fields of the transmitted microwaves, which in the illustrated arrangement is the ferromagnetic body 32, a spatial position thereof relative to the microwave structure 15 is arranged determines the frequency of microwaves which can be transmitted through the microwave structure so that there is no reverse propagation in the opposite direction between the ports 12, 13. The spatial position is arranged such that a magnitude of a magnetic portion of the electromagnetic fields of the microwaves transmitted along the transmission line is less than the maximum magnitude thereof, and a magnitude of an electric portion of the electromagnetic field of these microwaves is greater than zero. In other words, the ferromagnetic body should not be positioned relative to the microwave structure where:

The magnetic field of the transmitting microwave is at its maximum;
The electric field of the transmitting microwave tends to zero, that is, where it is at its minimum.

It will be appreciated that at different spatial positions of the resonant magnetic source, the strength of dissipative coupling and coherent coupling varies. As the frequency separation between the center and side ZDCs is dependent on the interference between the dissipative and coherent couplings, the position of the resonant magnetic source thus can be used to tune primarily the frequency of the side-ZDC as the center ZDC stays generally in fixed location relative to the frequency of cavity structure resonance which is fixed.

Typically, the external magnetic field 29 determines the direction between the ports 12, 13 in which the unidirectionality is exhibited; however, an appropriate positioning of the ferromagnetic body 32 can act to reverse the direction of unidirectionality.

In further regard to the resonant magnetic source, the spatial position thereof relative to the microwave structure 15 is adjustable such that the device 10 can be tuned to provide unidirectional propagation for various frequencies of microwaves. In the illustrated arrangement, the ferromagnetic body 32 is mounted on a displacement lever so that its spatial position relative to the microwave structure 15 can be changed so as to change the set of hybridized resonant frequencies.

The magnetic source 27 providing the external static magnetic field can be a permanent magnet, a coil carrying electric current, or a combination of them so as to provide an electromagnet or an electropermanent magnet.

Additionally to suitably magnetising the ferromagnetic body 32, a direction of the static magnetic field of the magnetic source also affects a direction of unidirectionality through the device as previously described, although the resultant direction is a combined effects due to both the magnetic source and the ferromagnetic body. In other words, the direction of the static magnetic field of the magnetic source substantially sets a single direction of microwave propagation, which can be supported by suitably positioning the ferromagnetic body relative to the microwave structure and alternatively reversed by appropriate positioning of the ferromagnetic body.

In order to provide further tuning of the hybridized resonant frequencies so as to be able to obtain the frequency of the microwaves to be transmitted through the device 10, the device 10 further includes an antenna 40 such as a loop antenna which is supported adjacent the ferromagnetic body 32 and is arranged to magnetically interact with the ferromagnetic body so as to modify properties of the body that are associated with the induced magnetic field thereof for tuning at least one of the set of hybridized resonant frequencies.

The antenna 40 can magnetically interact with the ferromagnetic body 32 primarily in one of two ways. Firstly, if the antenna is non-energized, the antenna 40 magnetically interacts with the ferromagnetic body 32 by coupling with the induced magnetic field 35 thereof to change an extrinsic damping rate of the body 32, more particularly that portion of the extrinsic damping rate which is affected by non-radiative factors which is different from a radiative extrinsic damping rate discussed in more detail hereinafter. This is due to a leakage of energy from the induced magnetic field 35 caused by presence of the antenna 40 therein. The change in non-radiative extrinsic damping rate causes one of the hybridized resonant frequencies, specifically that which is associated with a side-zero damping condition (side ZDC), to shift. In this type of interaction of the antenna, the antenna is arranged at a prescribed position where it is disposed in the induced magnetic field 35 of the ferromagnetic body, and its position relative to the ferromagnetic body 32 is adjustable such that the one tunable hybridized resonant frequency is changed by repositioning the antenna 40 relative to the ferromagnetic body.

Secondly and alternatively, if the antenna is energized for example by a direct (DC) electrical current so as to provide a distinct static magnetic field generated by the antenna and emanating therefrom, the antenna magnetically interacts with the ferromagnetic body by inducing the ferromagnetic body 32 to change the resonant frequency thereof, so as to tune the both of the set of hybridized resonant frequencies. This is because changing the body's resonant frequency acts to change both the side ZDC of the hybridized resonant frequencies as well as a center-zero damping condition which is proximal to the resonant frequency of the cavity structure relative to the side ZDC. In this case, instead of repositioning the antenna 40 to tune the hybridized resonant frequencies, a strength of the distinct static magnetic field of the energized antenna 40 is adjustable such that the set of hybridized resonant frequencies is tuned by adjusting the field strength of the energized antenna, such as by changing the magnitude of the electrical current passed through the antenna. The magnetic interaction of the energized antenna 40 is thus similar to the type of interaction between the ferromagnetic body 32 and the permanent magnet 27, and is particularly useful when the magnetic source represented by the permanent magnet 27 is fixed in magnitude and therefore, in the absence of the antenna or another magnetic field-source with adjustable field strength, provides a substantially fixed resonant frequency of the ferromagnetic body 32.

The related method for providing unidirectional signal transmission for microwaves generally comprises the steps of:

providing a microwave structure 15 configured to transmit the microwaves between two ports such as 12 and 13 and having a resonant frequency;

providing a magnetic source such as at 32, which is arranged to provide a generally static magnetic field 35 and to have a resonant frequency distinct from the resonant frequency of the microwave structure, adjacent the microwave structure 15 such that the magnetic field 35 of the magnetic source 32 interacts with electromagnetic fields of the microwaves transmitted through the microwave structure 15 so as to form a set of hybridized resonant frequencies at which zero damping exists in the microwave structure, one of the set of hybridized resonant frequencies being a real eigenvalue corresponding to a frequency providing substantially unidirectional propagation from one of the ports 12 or 13 to the other port;

applying an input microwave signal of an input frequency at a selected one of the two ports 12 or 13; and arranging the magnetic source 32 at a prescribed spatial position relative to the microwave structure 15 at which the eigenvalue which corresponds to transmission from the selected port 12 or 13 to the other one of the two ports becomes a pure real value which matches the frequency of the input signal, so that the input microwave signal is transmitted from the selected port to the other port substantially without transmission of any signals in a reverse direction.

The step of arranging the magnetic source at the prescribed position relative to the microwave structure comprises positioning the magnetic source 32 such that a magnitude of a magnetic portion of the electromagnetic field of the microwaves transmitted along the transmission line is less than the maximum magnitude thereof, and a magnitude of an electric portion of the electromagnetic field of said microwaves is greater than zero.

If simply repositioning the magnetic source 32 is insufficient to obtain the desired frequency for transmission, the method can further include a step of arranging an antenna 40 adjacent the magnetic source 32 to magnetically interact therewith in order to tune the eigenvalue which becomes the pure real value towards the frequency of the input signal. Typically this is done by modifying properties of the magnetic source which are associated with the magnetic field provided thereby. This may be achieved by arranging the antenna at a prescribed position relative to the magnetic source 32 to couple with the magnetic field 35 thereof. Additionally or alternatively, this may be achieved by providing a distinct static magnetic field of the antenna that is arranged to modify the resonant frequency of the magnetic source.

Figure 5A:
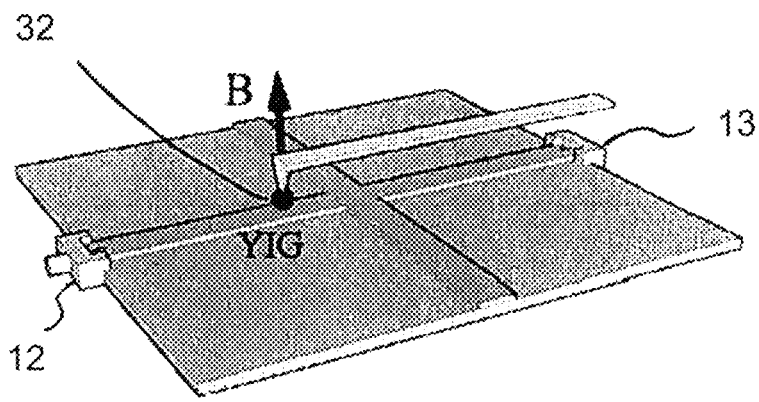
FIG. 5A is a schematic diagram of an experimental setup for the present invention, to which the subsequent drawing figures up but not including FIG. 9A relate.

An experimental setup for verifying the present invention is schematically shown in FIG. 5(a), where a yttrium iron garnet (YIG) sphere (1-mm diameter) is placed close to a crossline microwave circuit. The circuit is designed to support both standing and traveling waves [54], forming an open cavity where the external coupling is much larger than the intrinsic damping rate, and it may even become comparable to the cavity eigenfrequency. The YIG sphere is glued on the end of a displacement cantilever, enabling 3D-position control. A magnetic field of a few hundred millitesla is applied perpendicular to the cavity plane, controlling the magnon mode frequency $\omega_m$. The cavity mode at the frequency $\omega_c$ contributes to the coherent magnon-photon coupling (with the coupling rate J). The traveling wave causes the dissipation of magnons through radiation damping to the environment [51], inducing an effective dissipative coupling (with the rate $\Gamma$) between the cavity and the magnon modes [23, 52, 54]. In our setup, both J and $\Gamma$ can be drastically changed when moving the YIG sphere. Furthermore, according to Ampere's law, the phase of the rf field of the traveling wave at the YIG position differs by $\pi$ by reversing the propagation direction. Hence, the relative phase $\Theta$ between the coherent and dissipative couplings differs by $\pi$ for microwave signals loaded from port 1 and port 2. The spectroscopy is measured with a vector network analyzer through ports 1 and 2. As we will show below, these ingredients, i.e., the cooperation of coherent and dissipative couplings and their direction-dependent relative phase, govern the physics for the new scheme of non reciprocity.

To describe such an open cavity magnonic system, we construct the following non-Hermitian Hamiltonian that takes into account the loading configurations [54]:

$$\hat{H}/\hbar = \tilde{\omega}_c \hat{a}^\dagger \hat{a} + \tilde{\omega}_m \hat{b}^\dagger \hat{b} + (J - i\Gamma e^{i\Theta})(\hat{a}^\dagger \hat{b} + \hat{b}^\dagger \hat{a}). \quad (1)$$

Here, $\tilde{\omega}_c = \omega_c - i\beta$, $\tilde{\omega}_m = \omega_m - i\alpha$, $\hat{a}$ ($\hat{a}^\dagger$) and $\hat{b}$ ($\hat{b}^\dagger$) are the photon and magnon annihilation (creation) operators, respectively, and $\alpha$ and $\beta$ are the intrinsic damping rates of the magnon and cavity modes, respectively. Without losing generality, we choose $\Theta=0$ and $\pi$ for microwaves loaded from port 1 and 2, respectively.

The eigenvalues of Eq. (1), $\tilde{\omega}_\pm = 0.5\{\tilde{\omega}_c + \tilde{\omega}_m \pm \sqrt{[(\tilde{\omega}_c - \tilde{\omega}_m)^2 + 8(J - i e^{i\Theta}\Gamma)^2]}\}$, correspond to two hybridized modes that have intriguing properties. Their intrinsic damping rates $\text{Im}(\tilde{\omega}_\pm)$ may go to zero, which we define as the zero-damping condition (ZDC) [54]. For example, when $J=\Gamma>\alpha$, $\beta$, and for $\Theta=0$, ZDCs appear when $\omega_m \approx \omega_c - 2J\Gamma/\alpha$ and $\omega_m \approx \omega_c + 2J\Gamma/\beta$. For $\Theta=\pi$, the ZDCs appear when $\omega_m \approx \omega_c + 2J\Gamma/\alpha$ and $\omega_m \approx \omega_c - 2J\Gamma/\beta$. Peculiar transmission properties emerge at ZDCs, which we discover by calculating the transmission coefficient of the system using input-output theory [1,54]:

$$S_{21(12)} = 1 + \frac{\kappa}{i(\omega - \omega_c) - (\kappa + \beta) + \frac{-[iJ + \Gamma e^{i\Theta_{1(2)}}]^2}{i(\omega - \omega_m) - (\alpha + \gamma)}}. \quad (2)$$

Here, $\Theta_1 = 0$, $\Theta_2 = \pi$, and $\kappa$ and $\gamma$ are the external damping rates [54] of the cavity and magnon modes, respectively.

Figure 5B:
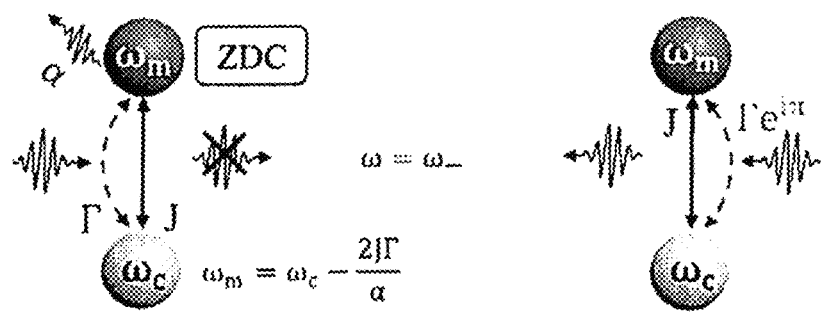
FIGS. 5B and 5C are schematic diagrams showing magnon-photon coupling and nonreciprocal microwave transmission at the ZDCs.
Figure 5C:
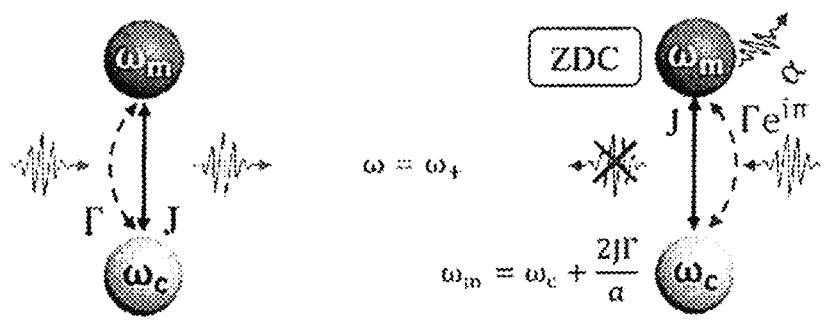

Noticeably, a term of $-2i\Gamma e^{i\Theta_{1(2)}}$ arises in Eq. (2) due to the interference of coherent and dissipative couplings. This term produces nonreciprocity. Most remarkably, we find that [54], for ZDCs at $\omega_m = \omega_c \pm 2J\Gamma/\alpha$, $$|S_{21}(\omega_-)| = |S_{12}(\omega_+)| = 0, \quad (3a)$$

$$|S_{12}(\omega_-)| = |S_{21}(\omega_+)| > 0, \quad (3b)$$

where $\omega_\pm = \text{Re}(\tilde{\omega}_\pm)$ are the frequencies of the hybridized modes and $S_{25(12)}$ is in the linear scale. Similar symmetry applies for the other pair of ZDCs at $\omega_m \approx \omega_c \pm 2J\Gamma/\beta$. Equation (3a) predicts unidirectional invisibility of microwave propagation at ZDCs through the open cavity magnonic system. Together with Eq. (3b), it implies a nonreciprocity that is mirror symmetric with respect to the cavity mode frequency. We highlight such striking effects in FIGS. 5(b) and 5(c). In the following, we experimentally verify them.

Figure 6A:
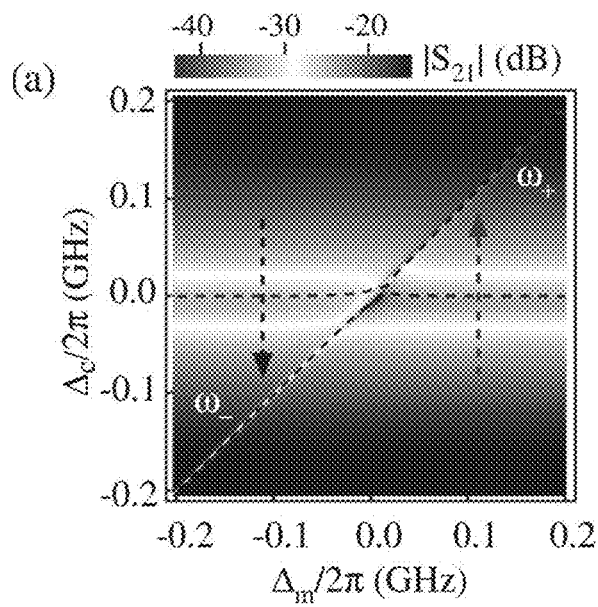
FIGS. 6A and 6B are graphs mapping $|S_{21}|$ and $|S_{12}|$, respectively, when $J/2\pi=\Gamma/2\pi=7.9$ MHz as a function of $\Delta_c$ and $\Delta_m$, and blue and magenta arrows (left hand side and right hand side, respectively) mark the bias fields at which the spectra plotted in (e)-(h) are measured, while the black dashed lines are the calculated dispersion curves.
Figure 6B:
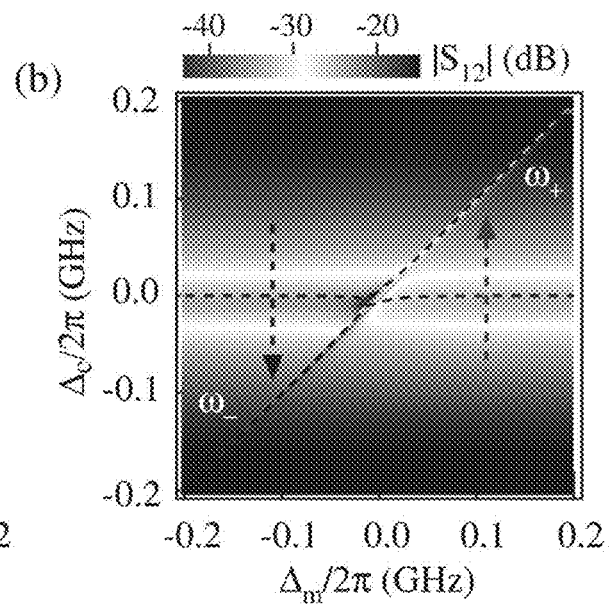
Figure 6C:
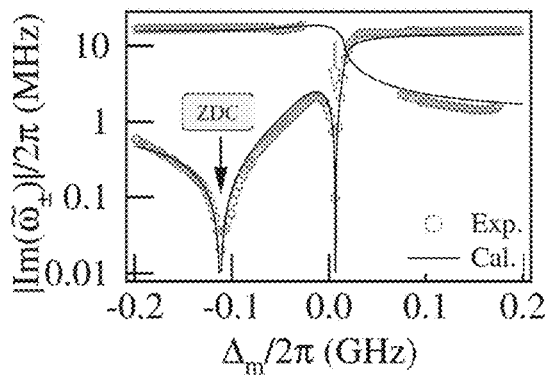
FIGS. 6C and 6D are graphs showing extracted intrinsic damping rates of the hybridized modes as a function of $\Delta_m$ (green circles), calculated imaginary part of the eigenvalues (black solid lines), and zero-damping conditions which are marked by arrows.
Figure 6D:
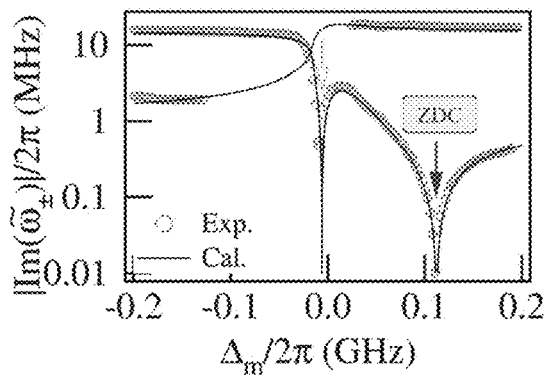

First, we present results measured by placing the YIG sphere at the position with a balanced coupling (J=Γ). We focus on the cavity mode $\omega_o/2\pi$=4.724 GHz. FIGS. 6(a) and 6(b) show, respectively, the mapping of $|S_{25}(\omega)|$ and $|S_{16}(\omega)|$, which are plotted as a function of the frequency detuning ($\Delta c = \omega - \omega_c$) and field detuning ($\Delta_m = \omega_m - \omega_c$). The intrinsic damping rates of two hybridized modes are fitted from $|S_{25}(\omega)|$ and $|S_{16}(\omega)|$ spectra and plotted as green circles in FIGS. 6(c) and 6(d), respectively. Theoretical eigenvalues, calculated from Eq. (1) using J/2π=Γ/2π=7.9 MHz, α/2π=1.1 MHz, and β/2π=15 MHz are plotted for comparison [54]. The real part eigenvalues Re($\tilde{\omega}_\pm$), plotted as the black dashed lines in FIGS. 6(a) and 6(b), agree well with the measured dispersion. The imaginary part eigenvalues |Im($\tilde{\omega}_\pm$)|, plotted as black solid curves in FIGS. 6(c) and 6(d), agree well with the measured damping rates. Two pairs of ZDCs predicted by Eq. (1) are observed, as marked by the arrows in FIGS. 6(c) and 6(d).

Figure 6E:
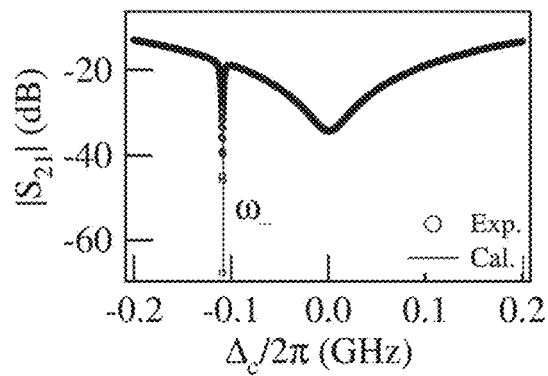
FIGS. 6E and 6F show measured and calculated $|S_{21}|$ and $|S_{12}|$ spectra, respectively, at the field marked by the blue (left-hand) arrow in FIGS. 6A-6B.
Figure 6F:
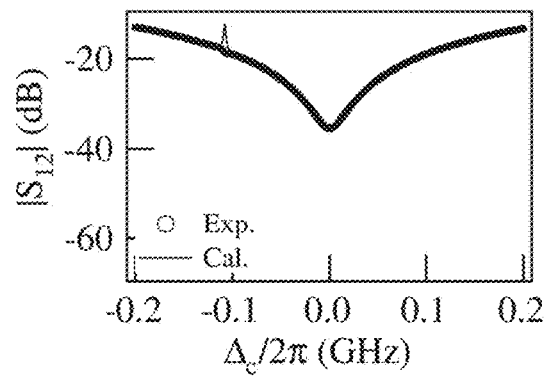

Unidirectional invisibility is also confirmed. Choosing the side ZDC marked by the blue arrow as an example, FIGS. 6(e) and 6(f) show the measured $|S_{21}(\omega)|$ and $|S_{16}(\omega)|$ spectra, respectively. An ultrasharp dip in $|S_{21}(\omega)|$ is observed at $\omega/2\pi = \omega_-/2\pi$=4.615 GHz. The calculated result using κ/2π=880 MHz and γ/2π=0.071 MHz, based on fitting Eq. (2) to the measured spectrum [54], is plotted as the thin curves for comparison. These spectra show that microwave transmission from port 1 to port 2 is completely blocked at this frequency. Similarly, unidirectional invisibility is found at $\omega/2\pi = \omega_+/2\pi$=4.833 GHz, as shown by the $|S_{25}(\omega)|$ and $|S_{16}(\omega)|$ spectra plotted in FIGS. 6(g) and 6(h), respectively, which are taken at the ZDC marked by the magenta arrow. Together, as highlighted in FIGS. 5(b) and 5(c), results of FIGS. 6(e)-6(h) verify the mirror symmetric nonreciprocity that is summarized by Eq. (3).

Next, we study the nonreciprocity with different combinations of coherent and dissipative coupling rates. The difference between the forward ($S_{21}$) and backward ($S_{12}$) transmission amplitudes is extracted in the decibel scale (defined as $20*\log_{10}|S_{21}/S_{12}|$), and we take its absolute value as the isolation ratio (iso). For the situation of J/2π=Γ/2π=7.9 MHz discussed in FIG. 2, the measured isolation ratio as a function of the working frequency ω and the field detuning $\Delta_m$ is plotted in FIG. 7(a). Four peaks appear at the two pairs of ZDCs, which we classify as central isolation peaks (2 and 3) and side isolation peaks (1 and 4). Away from the ZDCs, the isolation ratio gradually decreases following the dispersion of the hybridized modes. The theoretical calculation shown in FIG. 7(b) is in good agreement with the experimental result. Here, at balanced coupling, the dispersion plotted in solid curves indicates that the magnon and photon modes are simply crossing. This is consistent with our previous study [44]. Changing the position of the YIG sphere to adjust the coupling strengths, we find that the competition between coherent and dissipative couplings shapes the appearance of the isolation ratio. When J<Γ, the pattern of the isolation ratio reveals level attraction as shown in FIG. 7(c). In the J>Γ case, it shows level repulsion [FIG. 7(e)]. In both cases, the calculated results shown in FIGS. 7(d) and 7(f) agree well with the measured data. The small isolation peak above 4.8 GHz in FIGS. 7(c) and 7(e) is attributed to the effect of coupling between the cavity mode and a higher-order magnetostatic mode [42, 43], which we ignore in the calculation.

Apparently, this scheme of isolation is fundamentally different from the conventional nonreciprocal response utilizing either Faraday rotation or ferromagnetic resonance [18-22], where large ferrites and complex port design (involving resistive sheets, quarter-wave plates, etc.) are needed, making it bulky for integration. In our case, the YIG sphere is only 1 mm in diameter. The isolation is the result of a synergetic contribution of the cavity mode, the magnon mode, and the interference between their coherent and dissipative interactions. The distinction is most clearly seen from the fact that the nonreciprocity disappears when either J=0 or Γ=0 [54].

Figure 8A:
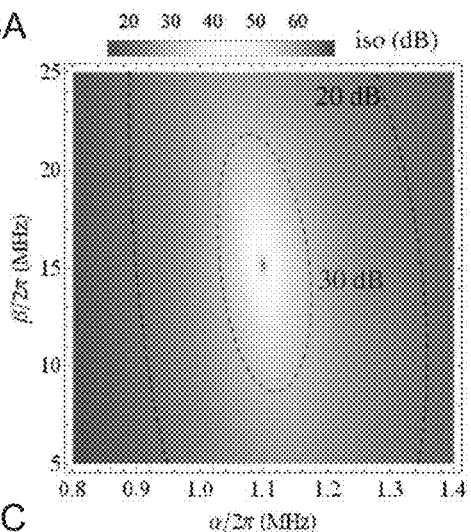
FIGS. 8A and 8B are graphs showing isolation ratio near the side isolation peak plot as a function of (a) the intrinsic mode damping rates $\alpha$ and $\beta$, and (b) the coupling strengths $J$ and $\Gamma$, respectively, wherein the black and red dashed lines (outer and inner circles, respectively) are the contour lines of 20 and 30 dB isolation ratio, respectively.
Figure 8B:
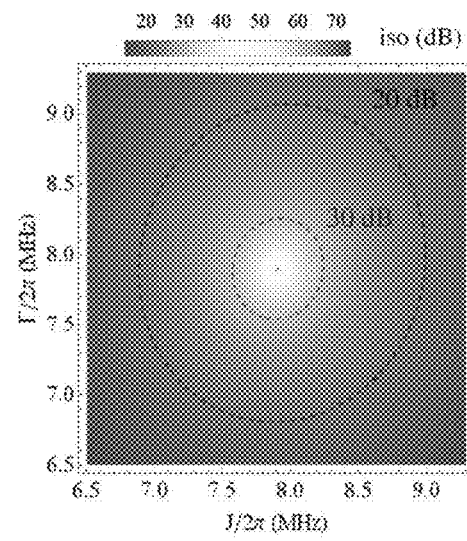

Such unique nonreciprocal dynamics enable flexible controllability. In addition to the detuning that we have shown, the coupled system has a series of other control parameters. Taking a working frequency of ω=2π×4.620 GHz as an example, FIG. 8(a) shows the isolation ratio near the side peak as a function of intrinsic damping rates α and β, which is calculated by fixing the coupling strengths J/2π=Γ/2π=7.9 MHz. The black and red dashed lines are the contour lines of 20 and 30 dB of isolation, respectively. In this case, the isolation ratio is more sensitive to α than β, because the side isolation is governed by the magnonlike hybridized mode. Similarly, isolation can be controlled by tuning the coupling rates J and Γ, as shown in FIG. 8(b) by fixing α/2π=1.1 MHz and β/2π=15 MHz. In this case, again, an isolation ratio above 30 dB can be achieved by adjusting the YIG position to control the coupling rates.

Figure 8C:
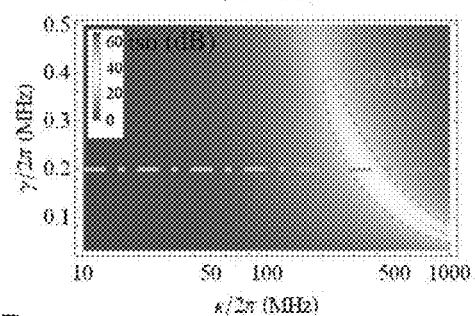
FIG. 8C is a graph of isolation ratio as a function of the external damping rates $\kappa$ and $\gamma$, wherein the green dashed line is the contour line of the isolation ratio equal to 20 dB.
Figure 8E:
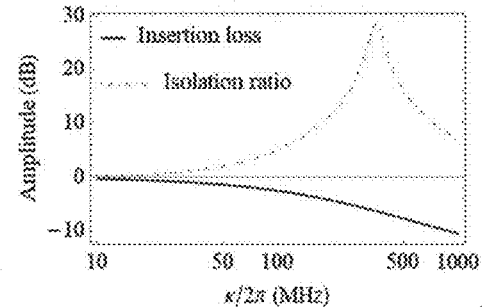
FIG. 8E is a graph of amplitude of the isolation ratio (upper broken line) and insertion loss (lower solid line) as a function of $\kappa$ when $\gamma/\pi=0.2$ MHz.
Figure 8D:
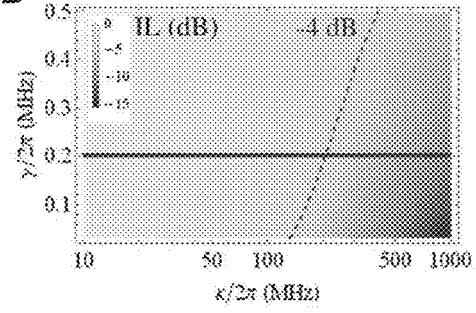
FIG. 8D is a graph of insertion loss as a function of $\kappa$ and $\gamma$, wherein the red dashed line (extending from bottom central location, upwards and to the right) is the contour line of the insertion loss equal to −4 dB.
Figure 8F:
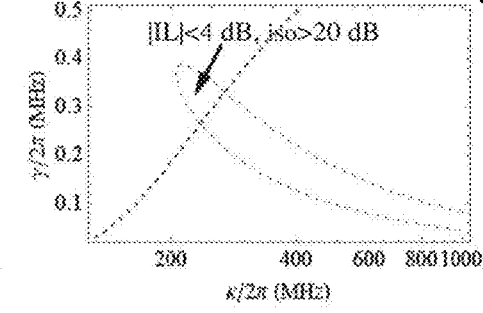
FIG. 8F is a graph showing the contour lines from FIGS. 8C and 8D (for clarity, the loop from right to left is the contour line of FIG. 8C and the curve extending upwardly and to the right from bottom left-hand corner is the contour line of FIG. 8D), where, in the region marked with an arrow, the insertion loss is less than 4 dB, and the isolation ratio is larger than 20 dB.

Finally, we note that, for practical applications, another crucial performance index is the insertion loss (IL), The most desirable performance is achieved with a high isolation ratio and low insertion loss, which can be optimized in our system by choosing suitable external damping rates κ and γ, for the cavity and magnon modes, respectively. Setting α/2π=1.1 MHz, β/2π=15 MHz, and J/2π=7.9 MHz, the isolation ratio and insertion loss as a function of κ and γ are shown in FIGS. 8(c) and 8(d), respectively. The green dashed curve in FIG. 8(c) is the contour curve for 20 dB of isolation ratio, and the red dashed curve in FIG. 8(d) is the contour curve for −4 dB of insertion loss. The horizontal lines in FIGS. 8(c) and 8(d) are replotted in FIG. 8(e), showing the general trade-off between isolation ratio and insertion loss. The two contour curves in FIGS. 8(c) and 8(d) are replotted in FIG. 8(f), where we can clearly find an optimized region with small insertion loss (|IL|<4 dB) and considerably large isolation ratio (|iso|>20 dB) simultaneously.

In conclusion, by designing an open cavity magnonic system to harness the cooperative effect of coherent and dissipative magnon-photon couplings, we demonstrate a new scheme for realizing nonreciprocal microwave transmission in the linear response regime. Zero-damping conditions for hybridized modes are realized, at which unidirectional invisibility of microwave propagation is discovered. These effects are well explained by a model that takes into account the direction-dependent relative phase between coherent and dissipative magnon-photon couplings, which breaks the time-reversal symmetry for microwave propagation. These nonreciprocal dynamics have flexible controllability and enable optimized performance with large nonreciprocity and low insertion loss. The key physics of the interference between coherent and dissipative couplings is general and may be applied to other systems without any external magnetic field, such as superconducting circuits in which coherent and dissipative couplings may be implemented and controlled by coupling the systems to the environment.

As described hereinbefore, we reveal the cooperative effect of coherent and dissipative magnon-photon couplings in an open cavity magnonic system, which leads to nonreciprocity with a considerably large isolation ratio and flexible controllability. Furthermore, we discover unidirectional invisibility for microwave propagation, which appears at the zero-damping condition for hybrid magnon-photon modes. A simple model is developed to capture the generic physics of the interference between coherent and dissipative couplings, which accurately reproduces the observations over a broad range of parameters. This general scheme could inspire methods to achieve nonreciprocity in other systems.

Figure 9A:
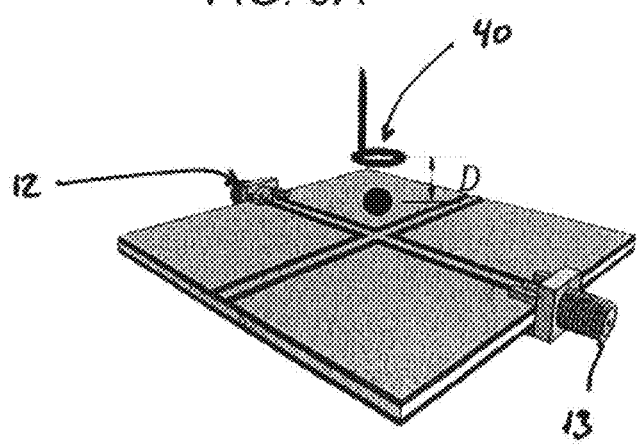
FIG. 9A is a schematic diagram of an experimental setup comprising a magnetic loop antenna, to which the subsequent drawing figures relate.
Figure 9B:
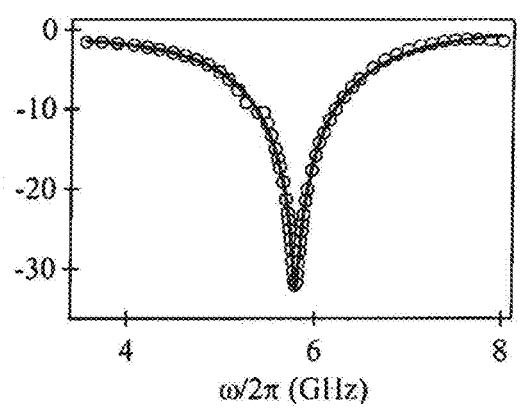
FIG. 9B is a graph of transmission spectrum ($S_{21}$) of the cavity at absence of magnetic field, the circle markers are measured data and the red curve is the calculated result.
Figure 9C:
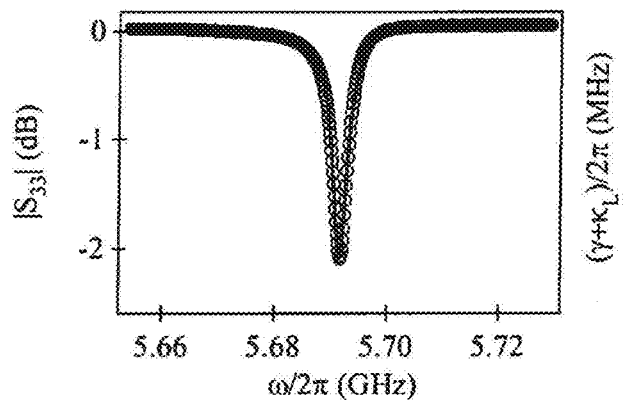
FIG. 9C is a graph of reflection spectrum from port 3 (i.e., the loop antenna) of YIG sphere at external field H=200 mT, with measurements indicated by circular markers and calculated values to determine the magnon damping rate indicated by the solid curve.
Figure 9D:
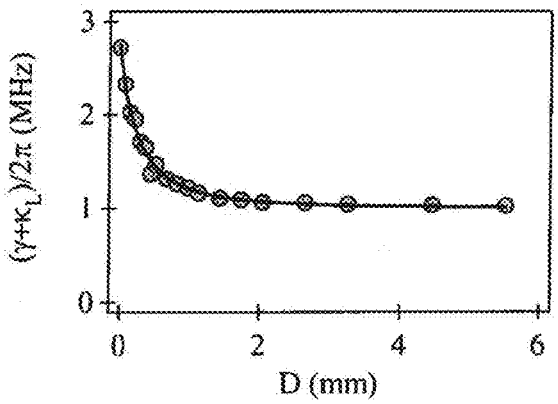
FIG. 9D is a graph of the damping rate of the magnon as a function of loop distance D, with measurements indicated by circular markers and the curve showing calculated values fitted by inverse square law.

FIGS. 9-12 relate to another experimental setup for verifying the present invention in which a loop antenna is integrated, as shown in FIG. 9(a), which will:

Vary the damping rate of the YIG sphere by a factor of about 3 [FIG. 9(d)]

Not change the dispersion of the hybridized mode [FIGS. 10(a) and 10(c)]

Figure 11A:
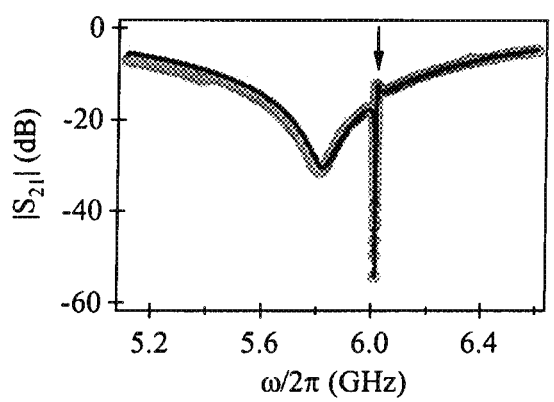
FIG. 11A is a graph of transmission ($S_{21}$) as a function of frequency near the side zero damping condition, in which markers correspond to measured values and the solid line is calculated.
Figure 11B:
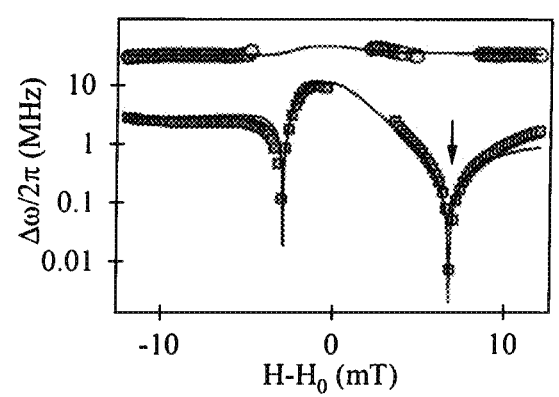
FIG. 11B is a graph of intrinsic linewidth of hybridized modes as a function of external magnetic field, where the curves show absolute values of imaginary parts of the system eigenvalues, and an arrow shows the position of side ZDC corresponding to the hybridized mode ($\omega_+$) indicated by the arrow in FIG. 11A.
Figure 11C:
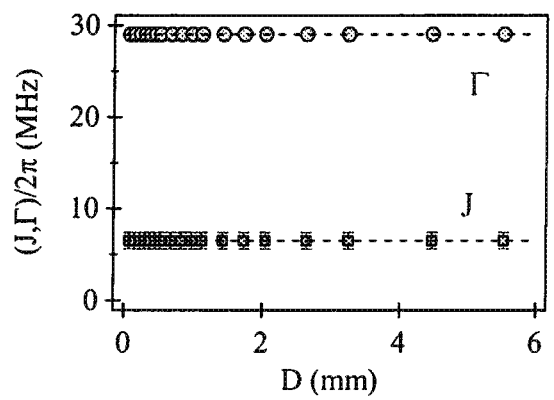
FIG. 11C is a graph of Coherent (J) and dissipative ($\Gamma$) coupling strengths as a function of loop distance D.
Figure 11D:
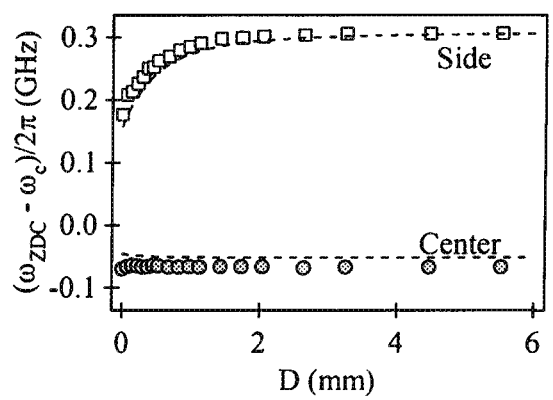
FIG. 11D is a graph of frequencies of ZDCs relative to cavity mode frequency as a function of D, the dashed line showing the theoretical calculation by assuming a constant coupling.

Move the ZDC up to 150 MHz [FIGS. 10(b), 10(d) and 11(d)]

Broaden the range of ISO>20 dB from 0.5 MHz to 200 MHz (i.e., the working or dynamic bandwidth) which is more practical for applications [FIGS. 12(b) and 12(f)]

In this second experimental setup, the magnetic loop antenna oriented to z direction was connected to a 3-D stage and allow precise position control the distance D (increasing the damping rate by $k_L$). A vector network analyzer (VNA) was used to measure the spectroscopy through port 1 indicated at 12 to port 2 indicated at 13.

With reference to FIGS. 10A-10D, the spectrum mapping thereof shows the dispersion which indicates the coupling strength have not experienced a significant change. While the surface plots clearly show the location of zero damping conditions and their shift. From the dashed lines, one of the ZDCs remained constant and the other experienced an 150 MHz shift towards higher frequency as the loop is moved away from the YIG sphere.

FIG. 11C shows that, since the relative position of the YIG sphere has been fixed, the coupling strength (J+iΓ) in is a constant.

The scope of the claims should not be limited by the preferred embodiments set forth in the examples but should be given the broadest interpretation consistent with the specification as a whole.

REFERENCES

[1] D. F. Walls and G. J. Milburn, Quantum Optics (Springer, Berlin, 2008).

[2] C. Caloz, A, Alù, S. Tretyakov, D. Sounas, K. Achouri, and Z.-L. Deck-L'eger, Electromagnetic Nonreciprocity, Phys. Rev. Applied 10, 047001 (2018).

[3] B. J. Chapman, E. I, Rosenthal, J. Kerckhoff, B. A. Moores, L. R. Vale, J. A. B. Mates, G. C. Hilton, K. Lalumi'ere, A. Blais, and K. W. Lehnert, Widely Tunable On-Chip Microwave Circulator for Superconducting Quantum Circuits, Phys. Rev. X 7, 041043 (2017),

[4] N. R. Bernier, L. D. TOth, A. Koottandavida, M. A. loannou, D. Malz, A. Nunnenkamp, A. K. Feofanov, and T. J. Kippenberg, Nonreciprocal reconfigurable microwave optomechanical circuit, Nat. Commun. 8, 604 (2017). [5] G. A. Peterson, F. Lecocq, K. Cicak, R. W. Simmonds, J. Aumentado, and J. D. Teufel, Demonstration of Efficient Nonreciprocity in a Microwave Optomechanical Circuit, Phys. Rev. X 7, 031001 (2017).

[6] F. Lecocq, L. Ranzani, G. A. Peterson, K. Cicak, R. W. Aumentado, J. D. Teufel, and J. Aumentado, Nonreciprocal Microwave Signal Processing with a Field-Programmable Josephson Amplifier, Phys. Rev. Applied 7, 024028 (2017).

[7] M. Shalaby, M. Peccianti, Y. Ozturk, and R. Morandotti, A magnetic non-reciprocal isolator for broadband terahertz operation, Nat. Commun. 4, 1558 (2013).

[8] M.-A. Miri, F. Ruesink, E. Verhagen, and A. Alù, Optical Nonreciprocity Based on Optomechanical Coupling, Phys. Rev. Applied 7, 064014 (2017).

[9] D. L. Sounas and A. Alù, Non-reciprocal photonics based on time modulation, Nat. Photonics 11, 774 (2017).

[10] H. Ramezani, P. K. Jha, Y. Wang, and X. Zhang, Nonreciprocal Localization of Photons, Phys. Rev. Lett. 120, 043901 (2018).

[11] K. Fang, J. Luo, A. Metelmann, M. H. Matheny, F. Marquardt, A. A. Clerk, and O. Painter, Generalized nonreciprocity in an optomechanical circuit via synthetic magnetism and reservoir engineering, Nat. Phys. 13, 465 (2017).

[12] Z. Shen, Y.-L. Zhang, Y. Chen, C.-L. Zou, Y.-F. Xiao, X.-B. Zou, F.-W. Sun, G.-C. Guo, and C.-H. Dong, Experimental realization of optomechanically induced non-reciprocity, Nat. Photonics 10, 657 (2016).

[13] J. Goulon, A. Rogalev, C. Goulon-Ginet, G. Benayoun, L. Paolasini, C. Brouder, C. Malgrange, and P. A. Metcalf, First Observation of Nonreciprocal X-Ray Gyrotropy, Phys. Rev. Lett. 85, 4385 (2000).

[14] R. Fleury, D. L. Sounas, C. F. Sieck, M. R. Haberman, and A. Alù, Sound isolation and giant linear nonreciprocity in a compact acoustic circulator, Science 343, 516 (2014).

[15] E. Walker, A. Neogi, A. Bozhko, Yu. Zubov, J. Arriaga, H. Heo, J. Ju, and A. A. Krokhin, Nonreciprocal Linear Transmission of Sound in a Viscous Environment with Broken P Symmetry, Phys. Rev. Lett. 120, 204501 (2018).

[16] Y. Wang, B. Yousefzadeh, H. Chen, H. Nassar, G. Huang, and C. Daraio, Observation of Nonreciprocal Wave Propagation in a Dynamic Phononic Lattice, Phys. Rev. Lett. 121, 194301 (2018).

[17] D. Torrent, O. Poncelet, and J.-C. Batsale, Nonreciprocal Thermal Material by Spatiotemporal Modulation, Phys. Rev. Lett. 120, 125501 (2018).

[18] M. Faraday, in Faraday's Diary, edited by T. Martin (George Bell and Sons, London, 1933), Vol. IV, p. 1839C.

[19] C. L. Hogan, The ferromagnetic Faraday effect at microwave frequencies and its applications, Rev. Mod. Phys. 25, 253 (1953).

[20] J. H. Rowen, Ferrites in microwave applications, Bell Syst. Technol. J. 32, 1333 (1953).

[21] J. D. Adam, L. E. Davis, G. F. Dionne, E. F. Schloemann, and S. N. Stizer, Ferrite devices and materials, IEEE Trans. Microwave Theory Tech. 50, 721 (2002).

[22] B. K. Kuanr, V. Veerakumar, R. Marson, S. R. Mishra, R. E. Camley, and Z. Celinski, Nonreciprocal microwave devices based on magnetic nanowires, Appl. Phys. Lett. 94, 202505(2009).

[23] A. Metelmann and A. A. Clerk, Nonreciprocal Photon Transmission and Amplification via Reservoir Engineering, Phys. Rev. X 5, 021025 (2015).

[24] L. Ranzani and J. Aumentado, A geometric description of nonreciprocity in coupled two-mode systems, New J. Phys. 16, 103027 (2014).

[25] Y. Shi, Z. Yu, and S. Fan, Limitations of nonlinear optical isolators due to dynamic reciprocity, Nat. Photonics 9, 388 (2015).

[26] H. Huebl, C. W. Zollitsch, J. Lotze, F. Hocke, M. Greifenstein, A. Marx, R. Gross, and S. T. B. Goennenwein, High Cooperativity in Coupled Microwave Resonator Ferrimagnetic Insulator Hybrids, Phys. Rev. Lett. 111, 127003 (2013).

[27] Y. Tabuchi, S. lshino, T. Ishikawa, R. Yamazaki, K. Usami, and Y. Nakamura, Hybridizing Ferromagnetic Magnons and Microwave Photons in the Quantum Limit, Phys. Rev. Lett. 113, 083603 (2014).

[28] X. Zhang, C.-L. Zou, L. Jiang, and H. X. Tang, Strongly Coupled Magnons and Cavity Microwave Photons, Phys. Rev. Lett. 113, 156401 (2014).

[29] M. Goryachev, W. G. Farr, D. L. Creedon, Y. Fan, M. Kostylev, and M. E. Tobar, High-Cooperativity Cavity QED with Magnons at Microwave Frequencies, Phys. Rev. Applied 2, 054002 (2014).

[30] L. Bai, M. Harder, Y. P. Chen, X. Fan, J. Q. Xiao, and C.-M. Hu, Spin Pumping in Electrodynamically Coupled Magnon-Photon Systems, Phys. Rev. Lett. 114, 227201 (2015).

[31] Y. Cao, P. Yan, H. Huebl, S. T. B. Goennenwein, and G. E. W. Bauer, Exchange magnon-polaritons in microwave cavities, Phys. Rev. B 91, 094423 (2015).

[32] L. Bai, M. Harder, P. Hyde, Z. Zhang, C.-M. Hu, Y. P. Chen, and J. Q. Xiao, Cavity Mediated Manipulation of Distant Spin Currents using a Cavity-Magnon-Polariton, Phys. Rev. Lett. 118, 217201 (2017).

[33] D. Zhang, Xiao-Qing Luo, Yi-Pu Wang, T.-F Li, and J. Q. You, Observation of the exceptional point in cavity magnonpolaritons, Nat. Commun. 8, 1368 (2017).

[34] Y. Tabuchi, S. Ishino, A. Noguchi, T. Ishikawa, R. Yamazaki, K. Usami, and Y. Nakamura, Coherent coupling between a ferromagnetic magnon and a superconducting qubit, Science 349, 405 (2015).

[35] D. Lachance-Quirion, Y. Tabuchi, S. Ishino, A. Noguchi, T. Ishikawa, R. Yamazaki, and Y. Nakamura, Resolving quanta of collective spin excitations in a millimeter-sized ferromagnet, Sci. Adv. 3, e1603150 (2017).

[36] A. Osada, R. Hisatomi, A. Noguchi, Y. Tabuchi, R. Yamazaki, K. Usami, M. Sadgrove, R. Yalla, M. Nomura, and Y. Nakamura, Cavity Optomagnonics with Spin-Orbit Coupled Photons, Phys. Rev. Lett. 116, 223601 (2016).

[37] X. Zhang, N. Zhu, C.-L. Zou, and H. X. Tang, Optomagnonic Whispering Gallery Microresonators, Phys. Rev. Lett. 117, 123605 (2016).

[38] J. A. Haigh, A. Nunnenkamp, A. J. Ramsay, and A. J. Ferguson, Triple-Resonant Brillouin Light Scattering in Magneto-Optical Cavities, Phys. Rev. Lett. 117, 133602 (2016).

[39] R. Hisatomi, A. Osada, Y. Tabuchi, T. Ishikawa, A. Noguchi, R. Yamazaki, K. Usami, and Y. Nakamura, Bidirectional conversion between microwave and light via ferromagnetic magnons, Phys. Rev. B 93, 174427 (2016).

[40] C. Braggio, G. Carugno, M. Guarise, A. Ortolan, and G. Ruoso, Optical Manipulation of a Magnon-Photon Hybrid System, Phys. Rev. Lett. 118, 107205 (2017).

[41] X. Zhang, C.-L. Zou, N. Zhu, F. Marquardt, L. Jiang, and H. X. Tang, Magnon dark modes and gradient memory, Nat. Commun. 6, 8914 (2015).

[42] D. Lachance-Quirion, Y. Tabuchi, A. Gloppe, K. Usami, and Y. Nakamura, Hybrid quantum systems based on magnonics, Appl. Phys. Express 12, 070101 (2019).

[43] M. Harder and C.-M. Hu, Cavity Spintronics: An early review of recent progress in the study of magnon-photon level repulsion, Solid State Phys. 69, 47 (2018).

[44] M. Harder, Y. Yang, B. M. Yao, C. H. Yu, J. W. Rao, Y. S. Gui, R. L. Stamps, and C.-M. Hu, Level Attraction due to Dissipative Magnon-Photon Coupling, Phys. Rev. Lett. 121, 137203 (2018).

[45] V. L. Grigoryan, K. Shen, and K. Xia, Synchronized spinphoton coupling in a microwave cavity, Phys. Rev. B 98, 024406 (2018).

[46] B. Bhoi, B. Kim, S.-H. Jang, J. Kim, J. Yang, Y.-J. Cho, and S.-K. Kim, Abnormal anticrossing effect in photon-magnon coupling, Phys. Rev. B 99, 134426 (2019).

[47] Y. Yang, J. W. Rao, Y. S. Gui, B. M. Yao, W. Lu, and C.-M. Hu, Control of the Magnon-Photon Level Attraction in a Planar Cavity, Phys. Rev. Applied 11, 054023 (2019).

[48] J. W. Rao, C. H. Yu, Y. T Zhao, Y. S. Gui, X. L. Fan, D. S. Xue, and C.-M. Hu, Level attraction and level repulsion of magnon coupled with a cavity anti-resonance, New J. Phys. 21, 065001 (2019).

[49] I. Boventer, C. Dörflinger, T. Wolz, R. Macêdo, R. Lebrum, M. Kläui, and Martin Weides, Control of the coupling strength and linewidth of a cavity-magnon polariton, arXiv:1904.00393.

[50] I. Proskurin, R. Macedo, and R. L. Stamps, Microscopic origin of level attraction for a coupled magnon-photon system in a microwave cavity, arXiv:1904.11570.

[51] B. Yao, T. Yu, X. Zhang, W. Lu, Y. Gui, C.-M. Hu, and Y. M. Blanter, Microscopic mechanism of level attraction from coherence-dissipation competition, arXiv:1906.12142.

[52] W. Yu, J. Wang, H. Y. Yuan, and J. Xiao, Realization of attractive level crossing via a dissipative mode, arXiv:1907.06222.

[53] L. D. Tóth, N. R. Bernier, A, Nunnenkamp, A. K. Feofanov, and T. J. Kippenberg, A dissipative quantum reservoir for microwave light using a mechanical oscillator, Nat. Phys. 13, 787 (2017).

[54] See Supplemental Material at http://link.aps.org/supplemental/10.1103/PhysRevLett.123.127202 for detailed description of experimental and theoretical methods including derivation of the effective Hamiltonian, zero-damping condition, and a discussion of other performance indices, etc. This material may also be found on pages 35-41 of earlier cross-referenced U.S. Provisional App. Ser. No. 62/947,631 filed Dec. 13, 2019, which is incorporated by reference herein.

The invention claimed is:

1. A device for providing a unidirectional propagation of microwaves comprising:
   first and second ports for coupling to other devices configured to generate or receive microwaves and between which the microwaves are to be transmitted;
   a magnetic source arranged to provide a static magnetic field;
   a microwave structure disposed in the static magnetic field and operatively coupled to the first and second ports so that the microwaves are transmittable therebetween, the microwave structure comprising:
   a transmission line configured for transmitting the microwaves between the first and second ports;
   a cavity structure which is electrically or magnetically coupled to the transmission line and configured to define a resonant frequency of the microwave structure which is exhibited along the transmission line; and a ferromagnetic body disposed in the static magnetic field and adjacent the microwave structure so as to be located in presence of electromagnetic fields emanating from the microwaves transmitted along the transmission line, and arranged so that an induced electromagnetic field emanating from the ferromagnetic body having a resonant frequency distinct from the resonant frequency of the microwave structure interacts with the electromagnetic fields of the microwaves so as to form a set of hybridized resonant frequencies at which zero damping exists, one of the set of hybridized resonant frequencies being a real eigenvalue providing the unidirectional propagation from one of the first and second ports to the other.

2. The device of claim 1 wherein a position of the ferromagnetic body relative to the microwave structure is adjustable such that the device is configured to be tuned to provide unidirectional propagation for various frequencies of microwaves.

3. The device of claim 1 wherein a position of the ferromagnetic body relative to the microwave structure is arranged such that, at said position, a magnitude of a magnetic portion of the electromagnetic fields of the microwaves transmitted along the transmission line is less than the maximum magnitude thereof, and a magnitude of an electric portion of the electromagnetic fields of said microwaves is greater than zero.

4. The device of claim 1 wherein the magnetic source is a permanent magnet.

5. The device of claim 1 wherein the ferromagnetic body comprises a ferrimagnetic material.

6. The device of claim 1 wherein the ferromagnetic body comprises yttrium iron garnet.

7. The device of claim 1 wherein the microwave structure is formed on a printed circuit board such that the transmission line is in the form of a microstrip, and the ferromagnetic body is adjacent a side of the printed circuit board on which the microstrip transmission line is formed.

8. The device of claim 1 further including an antenna supported adjacent to the ferromagnetic body and arranged to magnetically interact with the ferromagnetic body so as to modify properties of the ferromagnetic body associated with the induced magnetic field thereof for tuning at least one of the set of hybridized resonant frequencies.

9. The device of claim 8 wherein the antenna is non-energized such that the antenna magnetically interacts with the ferromagnetic body by coupling with the induced magnetic field of the ferromagnetic body to change an extrinsic damping rate of the ferromagnetic body, so as to tune one of the set of hybridized resonant frequencies.

10. The device of claim 9 wherein a position of the antenna relative to the ferromagnetic body is adjustable such that said one of the set of hybridized resonant frequencies is tuned by repositioning the antenna.

11. The device of claim 8 wherein the antenna is energized with an electrical current so as to provide a distinct static magnetic field such that the antenna magnetically interacts with the ferromagnetic body by inducing the ferromagnetic body to change the resonant frequency thereof, so as to tune the set of hybridized resonant frequencies.

12. The device of claim 11 wherein a strength of the distinct static magnetic field of the antenna is adjustable such that the set of hybridized resonant frequencies is tuned by adjusting the strength of the distinct static magnetic field.

13. The device of claim 8 wherein the antenna is a loop antenna.

14. The device of claim 1 for use as an isolator.

15. The device of claim 1 for use as a circulator.

16. The device of claim 1 for use in microwave imaging.

17. The device of claim 1 for use in microwave switching.

18. A method of providing a unidirectional signal transmission for microwaves comprising:
providing a microwave structure configured to transmit the microwaves between two ports and having a resonant frequency;
providing a magnetic source, which is arranged to provide an electromagnetic field and to have a resonant frequency distinct from the resonant frequency of the microwave structure, adjacent the microwave structure such that the electromagnetic field of the magnetic source interacts with electromagnetic fields of the microwaves transmitted through the microwave structure so as to form a set of hybridized resonant frequencies at which zero damping exists in the microwave structure, one of the set of hybridized resonant frequencies being a real eigenvalue corresponding to a frequency providing substantially unidirectional propagation from one of the ports to the other port;
applying an input microwave signal of an input frequency at a selected one of the two ports; and
arranging the magnetic source at a prescribed position relative to the microwave structure at which the eigenvalue which corresponds to transmission from the selected port to the other one of the two ports becomes a pure real value which matches the frequency of the input signal, so that the input microwave signal is transmitted from the selected port to the other port substantially without transmission of any signals in a reverse direction.

19. The method of claim 18 wherein arranging the magnetic source at the prescribed position relative to the microwave structure comprises positioning the magnetic source such that a magnitude of a magnetic portion of the electromagnetic field of the microwaves transmitted along the transmission line is less than the maximum magnitude thereof, and a magnitude of an electric portion of the electromagnetic field of said microwaves is greater than zero.

20. The method of claim 18 further including arranging an antenna adjacent the magnetic source to magnetically interact with the magnetic source in order to tune the eigenvalue which becomes the pure real value towards the frequency of the input signal.

21. The method of claim 20 wherein arranging the antenna to magnetically interact with the magnetic source in order to tune the eigenvalue which becomes the pure real value towards the frequency of the input signal comprises arranging the antenna at a prescribed position relative to the magnetic source to couple with the magnetic field thereof.

22. The method of claim 20 wherein arranging the antenna to magnetically interact with the magnetic source in order to tune the eigenvalue which becomes the pure real value towards the frequency of the input signal comprises providing a distinct static magnetic field of the antenna arranged to modify the resonant frequency of the magnetic source.

* * * * *